United States Patent
Gaebel et al.

(10) Patent No.: US 7,164,369 B2
(45) Date of Patent: Jan. 16, 2007

(54) SYSTEM FOR IMPROVING STORAGE EFFICIENCY OF DIGITAL FILES

(75) Inventors: Gary L. Gaebel, Vancouver, WA (US); Burton L. Levin, Lake Oswego, OR (US); Uoc H. Nguyen, Long Beach, CA (US)

(73) Assignee: Sharp Laboratories of America, Inc., Camas, WA (US)

( * ) Notice: Subject to any disclaimer, the term of this patent is extended or adjusted under 35 U.S.C. 154(b) by 435 days.

(21) Appl. No.: 09/885,320

(22) Filed: Jun. 19, 2001

(65) Prior Publication Data
US 2002/0194175 A1 Dec. 19, 2002

(51) Int. Cl.
*H03M 7/00* (2006.01)

(52) U.S. Cl. .......................... 341/50; 382/239

(58) Field of Classification Search .............. 341/87, 341/51, 56, 67, 59, 63, 65, 50, 107; 382/239
See application file for complete search history.

(56) References Cited

U.S. PATENT DOCUMENTS

| | | | | |
|---|---|---|---|---|
| 4,319,225 A * | 3/1982 | Klose | ........................... | 341/51 |
| 4,325,085 A | 4/1982 | Gooch | | |
| 4,558,302 A | 12/1985 | Welch | | |
| 4,626,829 A * | 12/1986 | Hauck | ........................ | 341/63 |
| 4,780,713 A * | 10/1988 | Lundstrom | ................. | 345/536 |
| 4,876,597 A * | 10/1989 | Roy et al. | .................... | 348/143 |
| 4,888,645 A * | 12/1989 | Mitchell et al. | ............ | 382/235 |
| 5,058,187 A | 10/1991 | Kim | | |
| 5,058,197 A | 10/1991 | Honkomp et al. | | |
| 5,129,049 A | 7/1992 | Cuzzo et al. | | |
| 5,150,454 A | 9/1992 | Wood et al. | | |
| 5,179,378 A | 1/1993 | Ranganathan et al. | | |
| 5,260,693 A | 11/1993 | Horsley | | |
| 5,303,313 A * | 4/1994 | Mark et al. | .................. | 382/235 |
| 5,367,620 A | 11/1994 | Ito et al. | | |
| 5,442,458 A * | 8/1995 | Rabbani et al. | ............. | 382/247 |
| 5,479,587 A | 12/1995 | Campbell et al. | | |
| 5,483,622 A | 1/1996 | Zimmerman et al. | | |
| 5,550,541 A * | 8/1996 | Todd | ........................... | 341/51 |
| 5,703,907 A * | 12/1997 | James | ........................ | 375/240 |
| 5,710,561 A * | 1/1998 | Schmidt et al. | ............... | 341/63 |
| 5,731,768 A * | 3/1998 | Tsang | .......................... | 341/59 |
| 5,768,466 A | 6/1998 | Kawamura et al. | | |
| 5,799,113 A | 8/1998 | Lee | | |
| 5,802,242 A | 9/1998 | Kawamura et al. | | |
| 5,822,458 A | 10/1998 | Silverstein et al. | | |
| 5,999,272 A | 12/1999 | Dow et al. | | |
| 6,047,101 A | 4/2000 | Kawamura et al. | | |
| 6,078,722 A | 6/2000 | Kawamura et al. | | |
| 6,212,527 B1 | 4/2001 | Gustman | | |
| 6,225,922 B1 * | 5/2001 | Norton | ........................ | 341/87 |
| 6,230,172 B1 | 5/2001 | Purnaveja et al. | | |
| 6,233,586 B1 | 5/2001 | Chang et al. | | |
| 6,265,291 B1 | 7/2001 | Yu et al. | | |

(Continued)

FOREIGN PATENT DOCUMENTS

JP  06133284 A  5/1994

*Primary Examiner*—Peguy JeanPierre
(74) *Attorney, Agent, or Firm*—Chernoff, Vilhauer, McClung & Stenzel

(57) ABSTRACT

Data is partitioned and processed along a bit plane that includes symbols holding a particular place in the ordered symbol sequences of digital information to achieve efficient compression and reduce processing complexity.

5 Claims, 2 Drawing Sheets

U.S. PATENT DOCUMENTS

| | | |
|---|---|---|
| 6,268,812 B1 * | 7/2001 | Yoshimura .................... 341/68 |
| 6,311,189 B1 | 10/2001 | deVries et al. |
| 6,320,624 B1 | 11/2001 | Ayer et al. |
| 6,331,826 B1 * | 12/2001 | Wagner ........................ 341/59 |
| 6,356,665 B1 * | 3/2002 | Lei et al. ..................... 382/240 |
| 6,501,397 B1 * | 12/2002 | Radha et al. ................. 341/60 |
| 6,522,268 B1 * | 2/2003 | Belu ............................ 341/51 |
| 6,522,783 B1 * | 2/2003 | Zeng et al. .................. 382/239 |
| 6,563,884 B1 * | 5/2003 | Nikula ........................ 375/295 |
| 6,570,510 B1 * | 5/2003 | Chen et al. .................... 341/51 |
| 6,611,213 B1 * | 8/2003 | Bentley et al. ............... 341/51 |
| 6,690,305 B1 * | 2/2004 | Meroth et al. ................ 341/63 |

\* cited by examiner

SYSTEM FOR IMPROVING STORAGE EFFICIENCY OF DIGITAL FILES

CROSS-REFERENCE TO RELATED APPLICATIONS

Not applicable.

BACKGROUND OF THE INVENTION

The present invention relates to a data processing method and, more particularly, to a data processing method facilitating adaptive data compression.

Digital data is typically used in a format that optimizes usability but often requires data files that are at least twice as large as actually needed to represent the information. Data compression is a general term for a number of algorithms and computer programs that have been developed to convert data to a format optimized for compactness. In some instances, data compression can reduce the quantity of data necessary to represent information by orders of magnitude. Reducing the quantity of data processed and stored by a data processing system is important because data transmission and storage are significant elements in the processing time and cost of data processing systems. In some applications, such as digital video transmission, the quantity of uncompressed data is so great that practical systems would be cost and performance prohibitive without substantial data compression.

Data compression methods are generally classified as lossy or lossless. Lossless compression methods exploit statistical redundancy related to similarities, correlation, and predictability of data. When a lossless compression method is applied to a data file, the data after decompression will be identical to that of the original file. Data consistency is required for many types of data such as executable program code, word processing files, or tabulations of numbers. On the other hand, other types data files, including data for images and other acquired signals, can often be approximated when decompressed without an appreciable loss. For example, a digital imaging device may capture textural detail that is unobservable a human viewer when included in a video frame. If the changes made to these signals resemble a small amount of noise, the resulting distortion of the signal may go unnoticed or, at least, be tolerable. Lossy compression techniques exploit subjective redundancy in the data to identify and discard redundant and perceptually irrelevant information from the data file. Lossy compression typically compresses data more efficiently than lossless compression methods.

Many data compression schemes utilize several data compression techniques in a single composite process. For example, the MPEG-2 (ISO/IEC 13818) video compression standard utilizes a number of processes to compress the data within a single image (intraframe compression), between frames (interframe compression), and within the resulting data stream. Transform coding utilizing the discrete cosine transform (DCT) is used to analyze and model the frequency of the signal representing blocks of pixels in the image. Transform coding is followed by quantization in which the transform coefficients are "rounded off" discarding part of the information necessary to perfectly reconstruct the original block of pixels. Temporal redundancy in the sequence of video images is exploited by predictive interframe coding. The displacement of the image content between a reference frame and a predicted frame is estimated and quantified. The reference frame image is then displaced according to the estimate and the image content difference between the predicted frame and a motion compensated version of the reference frame or residual content is determined. The quantity of data necessary to describe a sequence of frames is substantially reduced by reconstructing the predicted frame from a motion compensated version of the reference frame and the residual. In addition, the data stream containing the compressed intraframe and interframe data is typically compressed with a lossless method such as Huffman coding and run length encoding where repeating data is replaced with shorter coded sequences.

While lossy techniques generally provide greater compression efficiency, the resulting data distortion can, at times, be objectionable. For example, the loss of information during the quantization of transform coefficients can produce several compression artifacts in the decompressed image. These artifacts include the visibility of blocks used in the transformation process and noise along sharp edges in decompressed images. In addition, many compression techniques are more efficient when compressing certain types of data. For example, DCT transform coding is best suited to natural images with relatively gradual transitions between areas of relatively consistent color. On the other hand, many images comprise a composite of elements including textual, graphical, and natural elements. To reduce objectionable compression artifacts and improve compression efficiency, images are often pre-processed and post-processed. To improve the efficiency of the compression process, the image may be examined before compression and a "guess" made about the nature of the visual element to which a pixel or group of pixels belongs so that the image may be separated into components of different types and an appropriate process selected for each type of component. After the image is decompressed, its pixels may be examined to identify and smooth the color transitions between adjacent pixels. While image pre-processing and post-processing is useful in increasing compression efficiency and repairing compression artifacts, it is computationally expensive, time consuming, and subject to errors.

What is desired, therefore, is a data processing method that facilitates adaptable and computationally efficient data compression utilizing efficient methods.

DETAILED DESCRIPTION OF THE INVENTION

Figure 1:
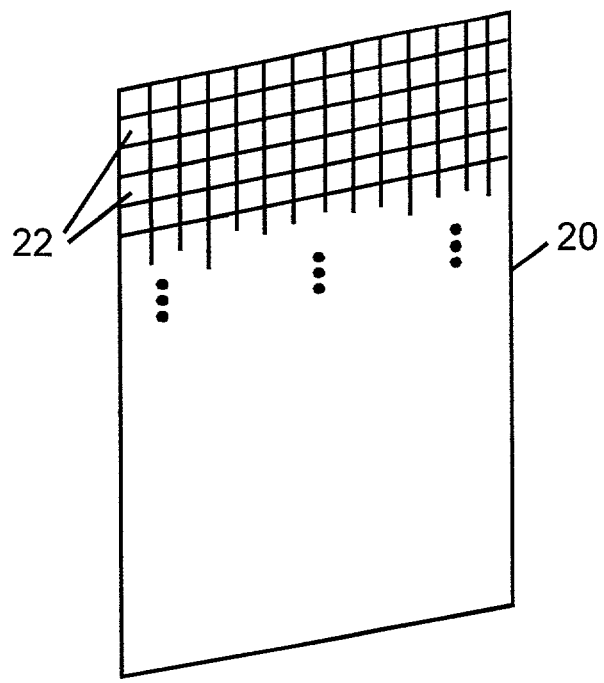
FIG. 1 is a schematic illustration of decomposition of an image into a array of pixels.

Information is an expression of an interaction between tangible and intangible objects. Digital computers and other digital electronic devices utilize information that can have only certain, fixed values. A fixed value of digital information or data is expressed as an ordered sequence of symbols. The value of each symbol or digit is a function of the value of the symbol and the place it occupies in the sequence. The place in the sequence of symbols represents a power of a base number for a numbering system. For example, in the decimal number "12" the least significant digit "2" represents the quantity (2) of units ($10^0$) and the most significant digit "1" represents the quantity of tens ($10^1$) included in the value of the sequence of symbols. Digital electronic devices typically utilize binary numbers where a symbol in the sequence or bit represents one of two possible states or values (1 or 0) and the position of the bit in the sequence of bits indicates a power of the base number "2". For example, a sequence of eight bits or a byte can represent values between 0 and 255. Digital information or data typically comprises a binary number expressed as ordered sequence or block of bits.

Lossless compression is a process that reduces the number of bits required to represent a block of data, but permits the bits of the original block to be restored exactly. Lossless compression exploits statistical redundancy in data and reduces the quantity of data by identifying and coding data similarities, correlation, and predictability. For example, run-length encoding is a lossless compression process that is useful in compressing data that contains repeated occurrences of the same symbol or group of symbols. For instance, an image of the night sky would include long runs of the symbol or symbols that represent the pixels of a black background. When a run of the appropriate symbol is detected, the encoder outputs the value of the symbol as a flag indicating the start of the run and follows the flag with the number of symbols included the run of symbols. Huffman encoding is another commonly used lossless compression technique. In this technique unique variable length code symbols are assigned to patterns symbols in the data according the frequency of repetition of the pattern. For example, if the letter "e" is the most frequently occurring symbol in a text document its bit sequence would be assigned the shortest code symbol (for example a single bit "1"). Less frequently used sequences are assigned longer, unique code symbol sequence. If the average length of the code sequence of the encoded data is shorter than the average length of the symbol sequences in the original data, the total amount of data will be reduced.

Lossy compression exploits subjective irrelevancy in the data. Lossy compression is typically applied to digitized signals, such as audio signals or image pixel values, where a degradation of the decompressed signal, with respect to the original signal, is perceptually irrelevant or, at least, tolerable. For example, lossy compression is often used in image processing where in exactitude in the color of a pixel is expected or, at least, tolerable and where the quality of the reconstructed image can be traded for compression efficiency. Lossy compression is typically a two-step process in which useful components of the data are identified and modeled and a portion of the data, considered to be perceptually irrelevant to the data's destination, is discarded. In image processing, adjacent pixels tend to be highly correlated. Transform coding is typically used to model image pixels and analyze the frequencies included in the visual signal. Quantization of the transform coefficients compresses the data by discarding a portion of the information necessary to perfectly describe the pixels. While the pixels of the image cannot be precisely reconstructed, the distortion produced by the loss of information may not be perceptually objectionable to a human viewer.

Data is typically generated, processed, and stored as a sequential progression of data blocks each comprising an ordered sequence of symbols representing the value of the sequence. For example, to compress and store an image, the image is scanned and decomposed to an array of pixels. In the case of a color image, the image is typically filtered and separated into a plurality (typically three or four) color planes. Each color plane is a gray scale image comprising pixels spatially corresponding to those of the scanned image. A pixel of a color plane has a luminous intensity or luminosity proportional to the intensity of the particular color component at that pixel. The image can be described by an array of symbol sequences. Each sequence comprises a specific number of bits or symbols expressing a value corresponding to the intensity of a pixel in the appropriate color plane. For example, an image may be separated into red, green, and blue color planes and the intensity of each pixel in each color plane represented by eight bits. If this color data is interlaced, the image can then be described by a data stream comprising a sequence of data blocks with each data block comprising an ordered sequence of 24 bits describing the intensity of the three color components making up the image. While compression algorithms typically detect and exploit irrelevancy and statistical redundancy in the stream of data, the present inventors discovered that compression efficiency can be often be improved and computational requirements reduced by partitioning the data along bit planes comprising the symbols holding one or more places in the plurality of ordered sequences and processing the data comprising bit planes.

Figure 2:
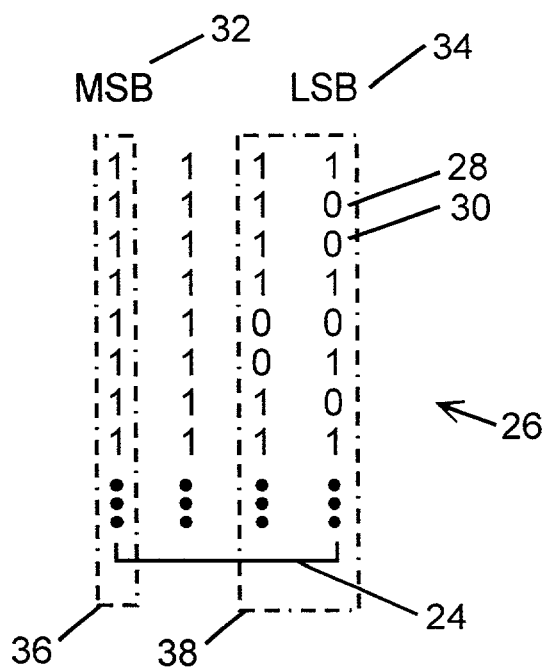
FIG. 2 is a schematic illustration of a method data processing according the present invention as applied to exemplary image pixel data.

FIG. 1 schematically illustrates the application of the data processing method in an image processing application. An image 20 is decomposed into an array of picture elements or pixels 22. The image 20 is typically a gray scale image. However, the gray scale image 20 may be one of the constituent color planes that are superimposed to create a color image. Color images are commonly displayed by superimposing red (R), green (G), and blue (B) color planes or superimposing cyan (C), magenta (M), yellow (Y), and black (K) color planes. Referring to FIG. 2, the luminous intensity of each pixel 22 of the image 20 is expressed as an ordered sequence of symbols 24 (indicated by a bracket) having four binary bits. A pixel having a four bit value can have an intensity equivalent to one of sixteen shades of gray ranging from black to white. For convenience, the intensities of the pixels 22 are illustrated as a rectangular array 26 of a plurality of ordered symbol sequences or blocks even though the blocks are typically processed in a sequential series of blocks. The present inventors recognized that while there is often statistical redundancy in the symbols of the serial sequence of data blocks, such as the repetition of the pixel value for the second 28 and third 30 pixels, there is often greater redundancy in the bits or symbols occupying a particular place or position in the plurality of ordered sequences. For example, the most significant bits (MSB) 32 of all the exemplary pixel values are the same. Likewise, the subjective effect of the value of a bit on the decompressed data is likely correlated to the bit's position in the ordered sequence. For example, pixels representing the sky in an image will be predominantly blue. Local variations in the shade of the sky will generally be accounted for by intensity variations expressed by changes in the least significant bit (LSB) 34 or a plurality of bits of lessor significance. A change in the MSB 32 for the four bit pixel values would correspond to a 50% variation in intensity which is unlikely for large areas of an image.

In the method of the present invention, the data of the array 26 is partitioned along bit planes containing the bits occupying a particular place or plurality of places in the ordered sequences making up the array. For example, the most significant bits of the bit sequences may be grouped in a single bit plane 36. Likewise, the least significant bits or the two least significant bits might occupy a bit plane 38. For convenience, the bits included in the bit plane can be assigned to a file and processed. Lossless or lossy compression algorithms are applied to the data in the file to reduce the quantity of data in the file. An algorithm can be selected that is likely to produce high compression efficiency or optimize compression efficiency and data distortion. For example, applying run length encoding to the bit plane 36 comprising the most significant bits of the data of the array 26 may achieve high efficiency because there are likely to be substantial runs of like bits. Lossless compression of the most significant bit plane 36 avoids distortion of the decompressed data and the possibility of substantial changes in the data and, for example, the color of the pixel represented by the data. On the other hand, a different compression algorithm may be more appropriate to a bit plane comprising least significant bits, such as bit plane 38. In the case of image data, a lossy compression technique applied to a bit plane of less significant bits may provide high compression efficiency without substantially subjectively impacting quality of the decompressed image.

Figure 3:
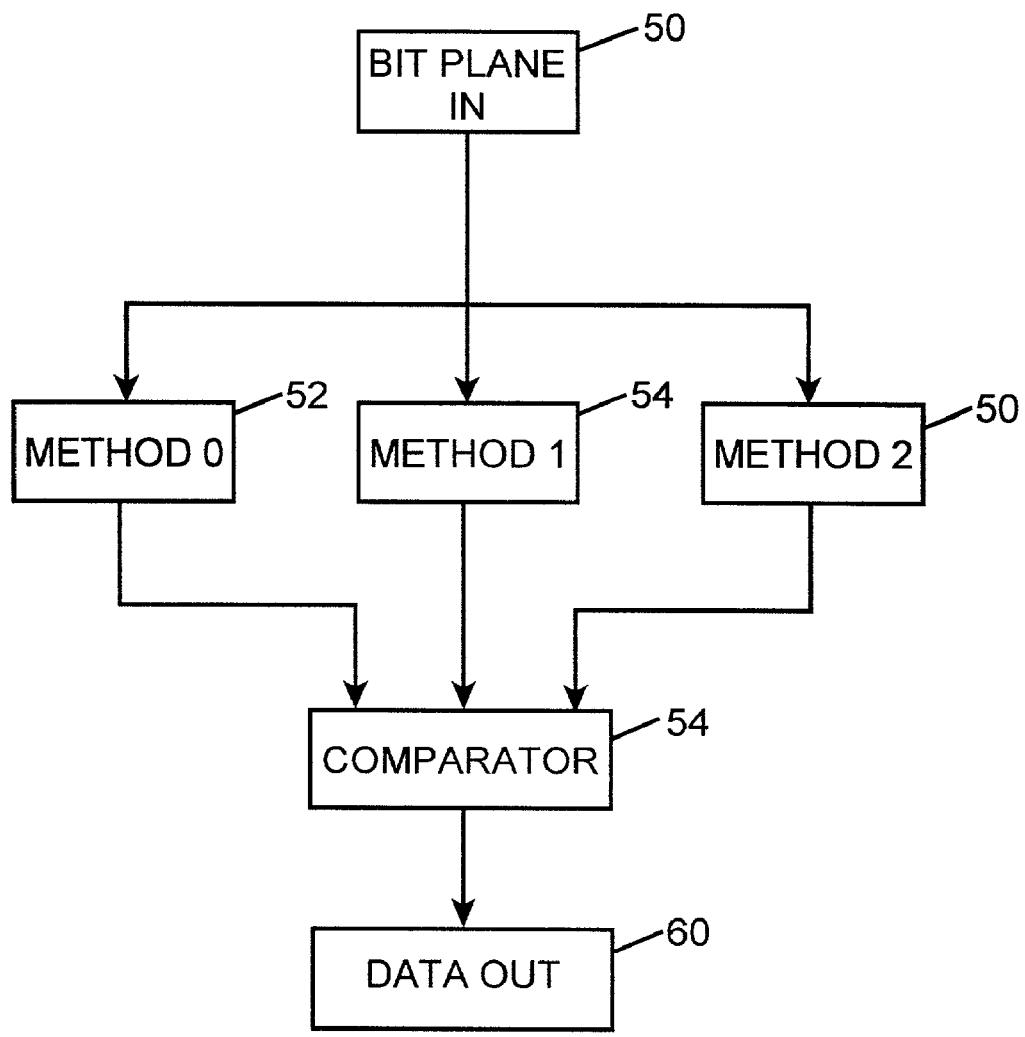
FIG. 3 is a schematic illustration of a method of adaptive data processing.

Since the bit planes may be processed by different methods, a data processing device that includes a library of compression algorithms can apply a plurality of algorithms to each plane for adaptive processing. Referring to FIG. 3, the symbols of a bit plane can be input 50 to a plurality or processing methods 52, 54, and 56. The results of the plurality of processes can be evaluated in a comparator 58 and the better result, either the smallest quantity of compressed data or the result optimizing another criterion, retained 60 and stored. Each bit plane may be processed sequentially in a single processor or the bit planes may be simultaneously input to several processors for parallel compression by a plurality of methods as illustrated in FIG. 3.

Data is typically processed as a series of ordered sequences or blocks. While significant compression can be achieved, data often has greater statistical redundancy when partitioned along a bit plane including the symbols occupying a particular place or places in the sequence of ordered symbols. This redundancy can be exploited to achieve high efficiency, adaptive compression and reduce computational complexity.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A method of compressing a digital image having a plurality of pixels, each of said plurality of pixels represented by a sequence including three ordered symbols, said method comprising:
   (a) organizing a plurality of said symbols into a first bit plane, each said symbol in said first bit plane occupying the same position in a respective sequence of ordered symbols for a pixel, wherein said first bit plane represents the most significant bit;
   (b) organizing a plurality of said symbols into a second bit plane, each said symbol in said second bit plane occupying the same position in a respective sequence of ordered symbols for a pixel;
   (c) organizing a plurality of said symbols into a third bit plane, each said symbol in said third bit plane occupying the same position in a respective sequence of ordered symbols for a pixel;
   (d) compressing said image by compressing said first bit plane;
   (e) compressing said image by compressing said second and third bit planes together as a group, wherein said first bit plane is compressed separate from the combination of said second and third bit planes, wherein said compressed first bit plane has a lower degree of loss than said compressed second and third bit planes.

2. The method of claim 1 where said bit plane is compressed using a lossless compression algorithm.

3. The method of claim 2 where said algorithm is a Huffman encoding scheme.

4. The method of claim 2 where said algorithm is a run length encoding scheme.

5. The method of claim 1 where compression of said bit plane reduces the number of symbols in said bit plane.

\* \* \* \* \*

UNITED STATES PATENT AND TRADEMARK OFFICE
CERTIFICATE OF CORRECTION

PATENT NO. : 7,164,369 B2 Page 1 of 1
APPLICATION NO. : 09/885320
DATED : January 16, 2007
INVENTOR(S) : Gaebel et al.

It is certified that error appears in the above-identified patent and that said Letters Patent is hereby corrected as shown below:

Column 5, line 23 - change "plurality or" to -- plurality of --

Signed and Sealed this

Seventeenth Day of June, 2008

JON W. DUDAS
*Director of the United States Patent and Trademark Office*